(12) United States Patent
Lin

(10) Patent No.: US 6,249,052 B1
(45) Date of Patent: Jun. 19, 2001

(54) SUBSTRATE ON CHIP (SOC) MULTIPLE-CHIP MODULE (MCM) WITH CHIP-SIZE-PACKAGE (CSP) READY CONFIGURATION

(76) Inventor: Paul T. Lin, 673 Hillcrest Ter., Fremont, CA (US) 94539

( * ) Notice: Subject to any disclaimer, the term of this patent is extended or adjusted under 35 U.S.C. 154(b) by 0 days.

(21) Appl. No.: 09/314,493

(22) Filed: May 18, 1999

Related U.S. Application Data

(60) Provisional application No. 60/087,604, filed on Jun. 1, 1998.

(51) Int. Cl.[7] .................................................. H01L 21/4763

(52) U.S. Cl. .......................... 257/737; 257/734; 257/778

(58) Field of Search ........................ 438/64, 48; 257/433, 257/734, 737, 778

(56) References Cited

U.S. PATENT DOCUMENTS 5,703,753 * 12/1997 Mok .
5,909,010 * 6/1999 Inoue .
5,949,142 * 9/1999 Otsuka .
6,002,178 * 12/1999 Lin .

* cited by examiner

Primary Examiner—Kevin M. Picardat
Assistant Examiner—D. M. Collins
(74) Attorney, Agent, or Firm—Bo-In Lin

(57) ABSTRACT

The present invention includes an integrated multiple-substrate-on-chip-module (MSOCM) assembly. This assembly includes a chip-size package (CSP)-ready MSOCM board having a top surface and a bottom surface. The CSP-ready MCM board includes a plurality of bonding-wire windows and the bottom surface further includes a plurality of board bonding-pads near the bonding-wire window. The assembly further includes an adhesive layer disposed on top of the CSP-ready MCM board having also having a plurality of bonding wire windows corresponding to and aligned with the bonding wire windows on the MCM board. The assembly further includes a plurality of integrated circuit (IC) chips mounted onto the adhesive layer over the top surface of the CSP-ready MCM board. Each of the IC chips is provided with a plurality of chip bonding pads facing an open space defined by the bonding wire windows. The assembly further includes a plurality of bonding wires disposed in the space defined by the bonding-wire windows and interconnected between each of the chip bonding pads and a corresponding board bonding pad disposed on the bottom surface of the CSP-ready MSOCM board.

21 Claims, 10 Drawing Sheets

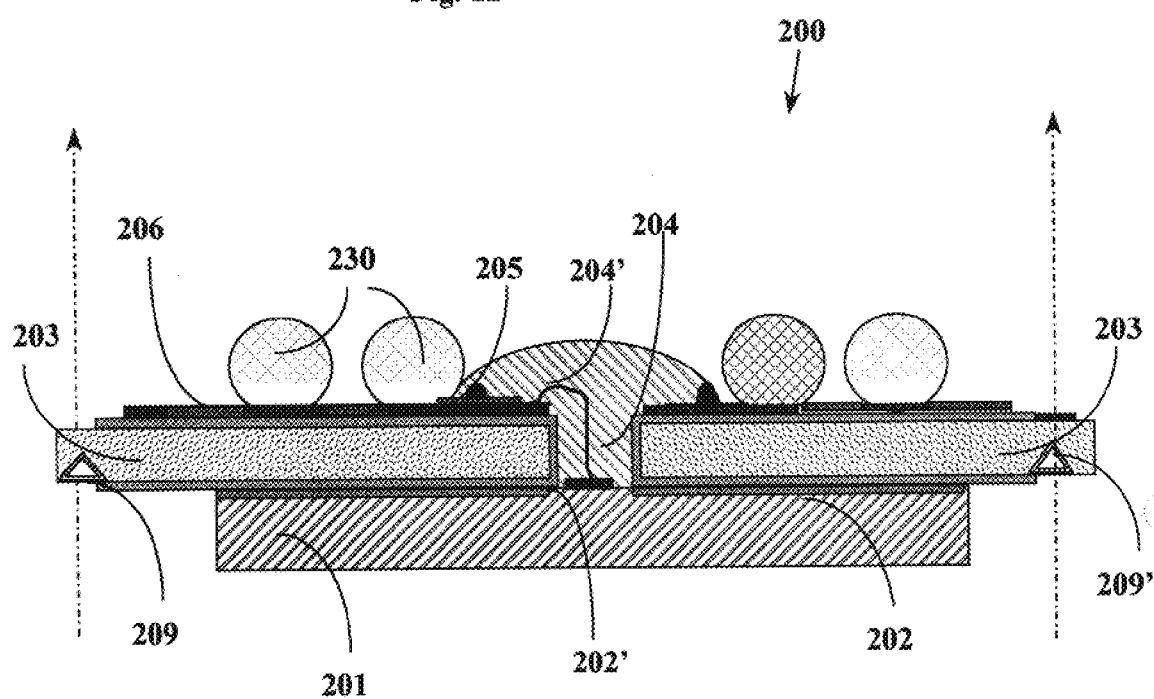

Fig. 2A
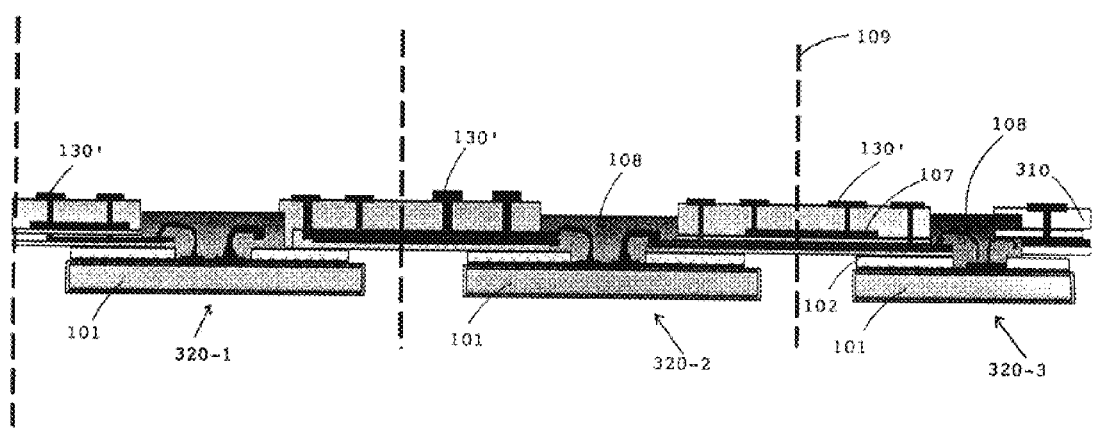
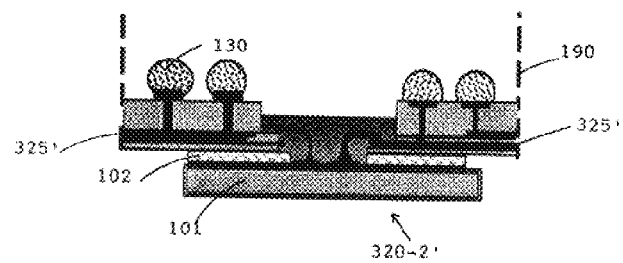
Fig. 2B

Fig. 5

VERY STRINGENT REQUIREMENTS FOR SMT PACKAGES

Package Qualification Tests with Level 3 Preconditioning

→ 10 X Temperature Cycle (16 to +150 deg. C)

→ Bake at 125 deg. C for 24 Hrs

→ Temperature Humidity Soak (30 deg. C, 60% RH, 192 Hrs)

→ Temperature Humidity Soak (30 deg. C, 60% RH, 192 Hrs)

→ Vapor Phase (215 deg. C, 60 Sec., 3 Passes)

Thermal Shock Test
Liq. to Liq. -65 to +150 deg. C
1,000 Cycles

Temperature Cycle Test
Air to Air -65 to +150 deg. C
1,000 Cycles

Autoclave Test
121 deg. C, 100% RH
15 PSIG, 96 Hrs.

Temp. Humidity Bias
85 deg. C, 85% RH
3.3 Volts, 1008 Hrs.

These requirements will not be applied on edge connected sub-system such as SIMM/DIMM, PCMCIA or Slot 2 formats.

SUBSTRATE ON CHIP (SOC) MULTIPLE-CHIP MODULE (MCM) WITH CHIP-SIZE-PACKAGE (CSP) READY CONFIGURATION

This Application claims a Priority Date of Jun. 1, 1998, benefited from a previously filed Provisional Application 60/087,604 filed on Jun. 1, 1998 by a same Inventor of this Patent Application.

BACKGROUND OF THE INVENTION

1. Field of the Invention

This invention relates generally to the electronic package. More particularly, this invention relates to a novel technique to simplify the manufacture process for a substrate of memory chip module with chip layout placing the bonding pads in the center portion of the chip. Furthermore, the substrate-on-chip chip modules are assembled as CSP-ready multiple-chip-module (MCM) packaging configuration. The assembling and testing processes of this CSP ready MCM are simplified to achieve a lower production cost. Furthermore, the procedures to repackage and utilize the know-good-die (KGD) packaged as a known-good-CSP (KGCSP) after testing is also simplified such that an effective method is provided to minimize the wastes of the known-good-dice.

2. Description of the Prior Art

There is a concern in applying the surface mount technology (SMT) to electronic package that package cracking, e.g., a pop corning phenomenon, may occur upon board mounting. This is generally caused by permeation of moisture through the plastic package body. In order to prevent this pop-corning phenomenon, very stringent requirements are imposed for SMT package design, materials, processes, dry packing, and qualification tests to prevent package cracks and to assure package reliability. FIG. 5 shows an example of such requirements for a SMT package. Time for production and costs are increased due to processes taken to satisfy these requirements. Examples of such packages are disclosed as that in U.S. Pat. No. 5,684,330, where the entire packaging structure is encapsulated with plastic molding. This type of packaging configuration is also implemented for most of the dynamic ransom access memory (DRAM) chips where the bonding pads are placed in the central portion of the chip. For the purposes of improving electrical performance and minimizing packaging width, a lead-on-chip (LOC) technology is applied. Each individual package is tested and burned in and good packages are then surface mounted on a module substrate in DIMM or PCMCIA format with edge connectors for socket applications. Examples of electronic packages are disclosed in U.S. Pat. No. 5,346,861 by Khandros et al., U.S. Pat. No. 5,068,712 by Murakami et al., and U.S. Pat. No. 4,862,245 by Pashby et al. As plastic molding of the entire structure is shown for these patented packaging assemblies, the difficulties of applying more elaborate stringent requirements for assembling and testing the packages are not resolved by these patented package configurations.

Furthermore, there is a different challenge faced by those applying the multiple-chip-module (MCM) technology to package multiple electronic chips into a single module. This challenge arises from the fact that a MCM module can function properly only if every chip assembled into this MCM package is individually a good die. Also, due to the accumulative effect, even a small percentage of reject rate for the individual chips, an unacceptable loss to the MCM packages is generated in using these chips. For example, a 99% chip acceptance rate for the individual chips, when assembled into eight-chip modules (X8 modules) as dual in-line memory module (DIMM) or single-in-line-memory module (SIMM) packages, an 8% loss or rework rate is generated which is clearly unacceptable.

In order to reduce wastes of resources committed to packaging chips which are not good dice, burn-in tests of individual chips are performed again after a wafer probe operation to identify the known good dice (KGD) before a MCM packaging processes are carried out. However, the processes for burning-in each individual chip or chip-size package (CSP) are very expensive due to the requirements of special testing sockets, and large dedicated burn-in board. Furthermore, difficult handling techniques are required to test these individual chips. Due to these special and expensive requirements for qualifying an integrated circuit (IC) chip as a known good die (KGD), it generally costs more to test a chip than to test a package. For the same reasons, the price of a known good die is approximately two to three times as that of a untested die. Even with the high cost of testing and a much higher price to use the KGD, due to the concern of accumulative losses when chips are assembled as multiple chip modules, there is no choice but to employ the KGDs.

In addition to the costs related to the requirement of using the chip size packages, two level of substrates or lead frames are employed in conventional multiple chip modules wherein known good dice contained in a CSP are assembled. The first level of substrate is used for packaging individual chips. The multiple chip module substrate is a second level substrate, which is used for mounting multiple chips each packaged in a CSP module. Additional costs are incurred in this two level substrate structure since it requires more material and processing. This two-level substrate structure further presents another disadvantage that the packages have a higher profile and higher thermal resistance causing poor heat dissipation. In order to enhance device miniaturization, more and more modern applications implemented with packaged electronic chips require a reduced thickness. Conventional MCM packages implemented with a two-level substrate structure have very limited usefulness in modern miniaturized devices when an electronic packages with a very small thickness are required.

Therefore, a need still exits in the art to provide an improved configuration and procedure for testing and packaging the multiple chip modules to reduce the cost of testing. The need also exists for a new configuration to more conveniently and economically reuse the known good dice when a known good die is packaged with other failed chips into a multiple-chip-module. There is further a need to provide an improved packaging configuration, particularly for the SMT packages with pop-corning difficulties, such that the packaging and testing requirements can be relaxed to shorten the production time and reduce the production costs without degrading the product reliability.

SUMMARY OF THE PRESENT INVENTION

It is therefore an object of the present invention to provide an improved packaging configuration to relax the manufacturing and testing requirements for the SMT electronic packages for individual IC dice. The IC chips are then assembled as an improved multiple chip modules (MCMs) to reduce the cost of testing and to more conveniently and economically save and reuse the known good dice after the testing. The improved chip module packages and the MCM assembly are provided to overcome the aforementioned difficulties and limitations encountered in the prior art.

Specifically, it is an object of the present invention to provide an improved chip module for surface mounting to an improved MCM assembly. The improved chip module is attached via an adhesive layer to the backside of a laminated board provided with a bonding wire opening and bonding pads on the top surface. The chip is then wire bonded to the board with bonding wires pass through the bonding wire opening. The chip module, i.e., a substrate on chip (SOC) module, is further configured as a chip-size package (CSP) ready assembly with via connectors penetrating the laminating board interconnecting the bonding pads to an array of solder balls to be placed on MCM assembly as a CSP.

Another object of the present invention is to provide an improved chip module for surface mounting to an improved MCM assembly. The encapsulation for the improved chip module is only required to cover the bonding wire opening for protecting the bonding wires such that the packaging procedures are simplified and the criteria for assembly and testing the package are significantly relaxed.

Another object of the present invention is to provide an improved chip module for surface mounting to an improved MCM assembly. The heat dissipation for the improved chip module is significantly improved because the entire back surface of the chip module is exposed for direct heat dissipation. Further improvement of heat dissipation is achieved by attaching the active IC surface to a single core metal of a long DIMM substrate for spreading the heat.

Another object of the present invention is to provide an improved MCM configuration and procedure for testing and packaging multiple chips as MCM assemblies. A CSP ready MCM board is employed wherein a plurality of CSP contact terminals are provided with CSP-ready via connectors penetrating the MCM board such that the probed good dice (PGD) packaged in SOC modules when assembled in a failed MCM can be conveniently separated and easily reused. These tasks can be accomplished without complicated and time consuming rework processes whereby the total production cost can be significantly reduced.

Another object of the present invention is to provide an improved MCM configuration and procedure for testing and packaging multiple chips as MCM assemblies by employing a CSP ready MCM board. A plurality of CSP contact terminals are provided with CSP-ready via connectors penetrating the MCM board such that the improved CSP-ready MCM board can be applied for different kinds of integrated circuit chips including flip-chips, wire-boding chips, and other types of chips. The novel CSP-ready reusable MCM board can be broadly applied to assemble various kind of electronic packages.

Another object of the present invention is to provide an improved MCM configuration and procedure for testing and packaging multiple chips as MCM assemblies by mounting multiple chips directly on a CSP-ready MCM board. Only a single level of substrate is required for majority of MCM assemblies, which pass the burn-in and functional tests such that the height of the package profile of the MCM assembly can be reduced.

Briefly, in a preferred embodiment, the present invention includes an integrated multiple-substrate-on-chip-module (MSOCM) assembly. This assembly includes a chip-size package (CSP)-ready MSOCM board having a top surface and a bottom surface. The CSP-ready MCM board includes a plurality of bonding-wire windows and the bottom surface further includes a plurality of board bonding-pads near the bonding-wire window. The assembly further includes an adhesive layer disposed on top of the CSP-ready MCM board having also having a plurality of bonding wire windows corresponding to and aligned with the bonding wire windows on the MCM board. The assembly further includes a plurality of integrated circuit (IC) chips mounted onto the adhesive layer over the top surface of the CSP-ready MCM board. Each of the IC chips is provided with a plurality of chip bonding pads facing an open space defined by the bonding wire windows. The assembly further includes a plurality of bonding wires disposed in the space defined by the bonding-wire windows and interconnected between each of the chip bonding pads and a corresponding board bonding pad disposed on the bottom surface of the CSP-ready MSOCM board.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIG. 1D is a cross sectional view of another substrate on chip (SOC) module with improved heat dissipation performance of this invention;

FIG. 2A shows the cross sectional view for a multiple chip module assembly of SOC modules supported on a CSP-ready MCM board of this invention;

FIG. 2B shows a cross sectional view of a known good SOC module separated from the MCM assembly of FIG. 2A after the burn-in tests and repackaged as a known good CSP chip according to the configuration of this invention;

FIG. 5 shows the processing steps implemented to satisfy the testing requirements of a conventional packaging configuration.

DETAILED DESCRIPTION OF THE PREFERRED EMBODIMENT

Figure 1A:
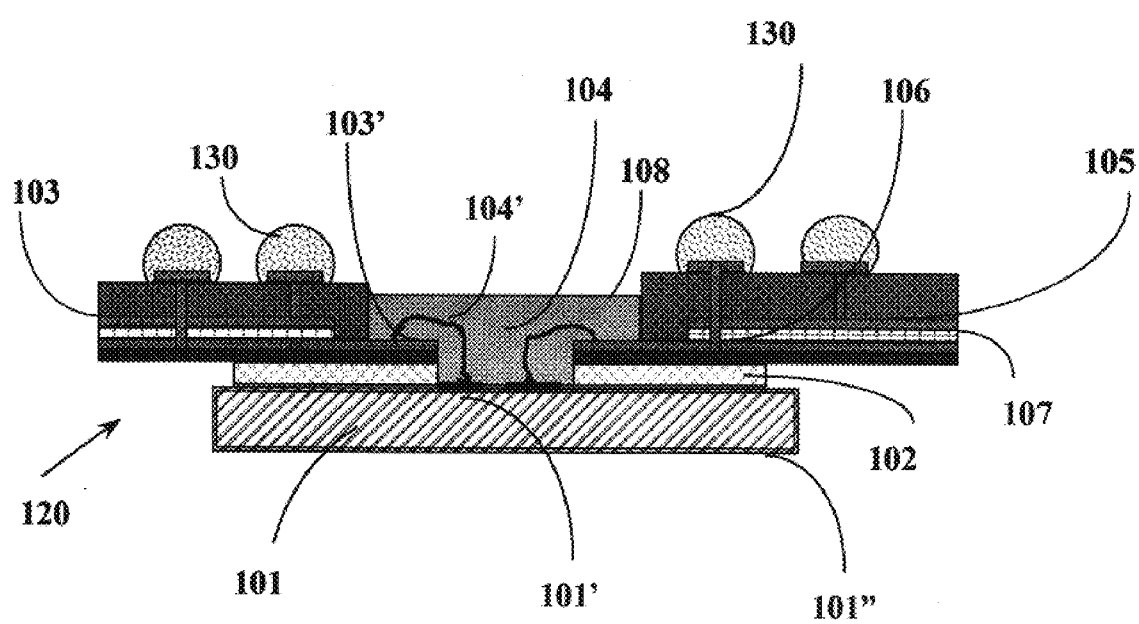
FIGS. 1A and 1B are cross sectional views of a chip memory module and multiple modules on an integrated printed-circuit board respectively of this invention provided with improved packaging configuration.

Please refer to FIG. 1A for a cross sectional view of a substrate-on-chip (SOC) memory module 120 of this invention. The SOC memory module 120 includes an integrated circuit (IC) chip 101, e.g., a memory chip with a central pads layout having the bonding pads placed near the center-portion of the chip. The memory chip 101 is attached to a laminated printed circuit board 103 via an adhesive layer 102. The laminated PCB 103 has a bonding-wire window 104 opened at the bottom layers provided for allowing a plurality of bonding wires 104' to pass through for interconnecting the bonding pads 101' on the memory chip 101 to corresponding bonding pads 103'. The multiple-layer laminated PCB 103 further includes a cavity 104' opened from the top layers of the PCB 103 on top of the bonding wire window 104. The cavity 104' is opened with slightly greater area than the bonding wire window 104 thus exposed the top surface of the bottom layers. The bonding pads 103' are placed on the exposed top surface of the bottom layers of the laminated PCB 103 exposed by the cavity 104". A plurality of metal traces 105 interconnect the substrate bonding pads 103' to a corresponding via connector 106 penetrating through the laminated PCB 103. Each of the via connector 106 is then connected to a corresponding solder balls 130. The multiple-layered laminated PCB 103 further includes built-in passive components 107 such as capacitors, resistors, or inductors depending on various requirements of specific circuit design. The cavity 104" and the bonding wire window 104 opened for wire bonding connections between the IC chip 101 and the circuit elements on the substrate 103 is then encapsulated. An encapsulation layer 108 is employed to seal and protect the IC chip 101 and the bonding-wires 104'. The SOC module 120 has a special advantage that the backside 101" of the IC chip 101 is totally exposed for direct heat dissipation. The thermal performance of the IC chip and the package is significantly improved.

Figure 1B:
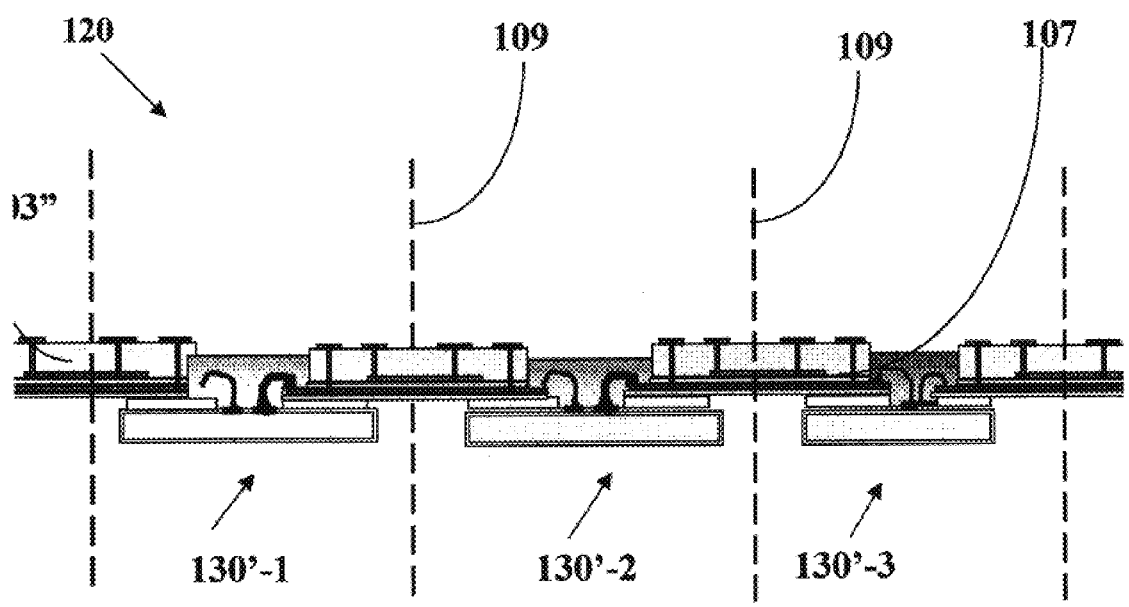

FIG. 1B shows another cross sectional view of multiple SOC modules of FIG. 1A manufactured and mounted on an integrated multiple-layered laminated PCB 103". The integrated PCB 103" has separation lines 109 provided between each individual SOC module. In stead of the solder balls as that shown in FIG. 1A, each of these individual-SOC modules is now provided with a land grid array 130'-1, 130'-2 and 130'-3. This assembly of multiple SOC modules mounted on an integrated PCB board 103" provided with separation lines can be implemented as a composite flip chip. This assembly as shown constitutes a CSP-ready multiple-chip-module (MCM) package. Providing these separation lines between the individual SOC modules achieves special advantages where each SOC module can be converted as a CSP chip as will be further described below.

The exact design and material of SOC 102 will depend of the particular layout of pad locations and the heat dissipation requirements. For the lowest cost approach, an industry-standards FR 4 glass-epoxy laminate is employed. Because it has a relatively low Tg in 110° C. to 130° C., high ultrasonic waves together with low temperature-thermal-compression-bonding below 120° C. must be applied. Also, the encapsulation curing temperature has to be kept below the temperature of Tg. In the case that high heat dissipation is required, metal core laminated substrate such as ViperB-GATM by Prolinx can be used. Obviously, the standard ball-grid-array (BGA) substrate of bismaleimide triazine (BT) resin laminate can also be employed. The width of the bonding wire opening will be very narrow in the range of 20 to 60 mils and the length is fairly long which is in the range of 150 to 300 mils depending on the die size. Double-sided adhesive of either thermal plastic or epoxy can be used to attach substrate to the front of memory device. Alignment of the dice will be required so that all centrally located bond pads will be exposed through the substrate window for subsequent wire bonding operation. The chip-size-package ready module substrate can also be built with integrated thin film passive components 107 such as capacitors and or resistor into a multiple layer structure to further reduce the size and improve the electrical performance of the memory module.

Figure 1C:
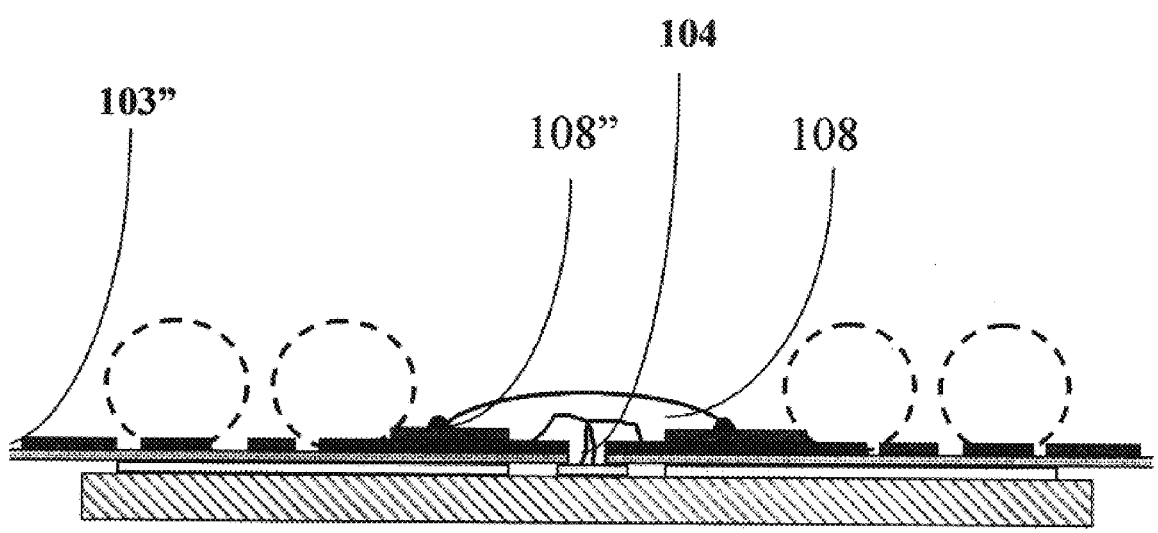
FIG. 1C is of a cross sectional view of another substrate on chip (SOC) module this invention.

FIG. 1C is a cross sectional view of another preferred embodiment of an SOC module 120' which is basically identically structured as the SOC module 120 shown in FIG. 1A. The only differences are first; the PCB laminated substrate 103" of this preferred embodiment is a single layer PCB board. There are no built-in passive components provided on several layers as that shown in FIGS. 1A and 1B above. Secondly, other than the bonding wire window 104, there is no separate cavity opened from the top as that of the multiple-layer laminated PCB board 103. Thirdly, the encapsulation 108' of this embodiment is a liquid encapsulation provided with encapsulation dam 108". This single layered SOC module has a special advantage that the manufacture processes are further simplified to achieve lower production costs. The lower cost is achieved by depositing the encapsulation material as a liquid drop in each cavity. The liquid encapsulation is then solidified after a curing process.

FIG. 1D is another preferred embodiment of an SOC module 200, which has improved thermal dissipation. The structure of this SOC module is similar to that shown in FIGS. 1A and 1C except that the substrate 203 is a metal core substrate. The IC chip is attached to the metal core substrate 203 via a low modules adhesive layer 202. The metal core substrate 203 has a window 204 for passing the bonding wires 204' there through. The cavity 204 is also padded with a dielectric or anodized layer 202'. The bonding wires 204' are electrically connected to interconnection metal traces 205 then connected to solder balls 230 separated by solder masks 206. The solder masks 206 provide special advantages that solder bridging is prevented and electric isolation of the solder balls 230 are improved. The SOC module is especially suitable for DIMM when higher heat dissipation rate is required. In addition to the advantage that the backside of the IC chip 201 is totally exposed for dissipating heat, the metal core substrate 203 further provides an excellent heat-conducting path. Heat generated from the IC chip 201 is conducted through the meal core substrate 203 to the solder balls 230. Higher heat dissipating rates are therefore achieved. The metal core substrate further includes prescribed separation lines 209 provided with a ridge opening 209' along each of the separation lines 209 such that each SOC module may be conveniently separated.

FIGS. 2A shows the cross sectional view of a multiple chip module 300 which includes multiple SOC modules, e.g., 320-1 to 320-3 as shown, supported on a CSP-ready MCM board 310, i.e., an integrated and ready-separable PCB, of this invention. This CSP ready MCM board is provided with a bonding wire cavity 104 for each SOC module. Similar to an SOC module shown in FIG. 1A except that the solder balls 130 are now replaced with a land-grid array. In addition, there are a plurality of conductive traces 105 for connecting between the circuit elements of other chips of multiple SOC modules, e.g., 320-1 to 320-3, etc. The CSP-ready MCM board 310 further includes a plurality of separation lines 109 between each SOC module.

By mounting these SOC modules 320-1 to 320-3 on this CSP-ready MCM board 310, the burn-in and testing processes can be performed directly on this MCM assembly 300 to determine if this MCM assembly 300, by packaging and connecting these SOC modules, is a good MCM assembly. If it is, then the whole MCM assembly 300 can be shipped out as a finished product. If one or several of these chips of the SOC modules are determined as unacceptable during the burn-in and testing processes, the MCM assembly is not useful in this MCM packaged form. However, several of the multiple SOC modules would have been identified as containing a known good die (KGD) after completion of the burn-in and testing processes. These SOC modules identified as containing a known good die can be separated from the CSP ready MCM board 310 by cutting them off from the separation lines 109. Referring to FIG. 2B, assuming that the SOC module 320-2 is identified as having a known good die, this SOC module 320-2 can be separated as an individual chip size package (CSP) 320-2'. This is accomplished by forming a solder-ball array 130 connecting to each of the CSP-ready land-grid-array 130' on the bottom surface provided in a cutoff section 109 of the CSP-ready MCM board 310 previously employed for supporting and packaging the MCM assembly 200. Each of these known good CSP chips, e.g., CSP chip 320-2', has exposed edge traces 325' which are used to interconnect multiple chips but are now cutoff to form this individual known good CSP chip 320-2' for reuse.

According to FIGS. 2A to 2B and above descriptions, the present invention discloses a chip-size package (CSP) ready multiple SOC module (MCM) board 310 having a top surface and a bottom surface for mounting and packaging a plurality of SOC modules 120-1 to 120-3 on the top surface. The MCM board is provided with a plurality of bonding wire windows for each of the SOC modules.

Figure 2C:
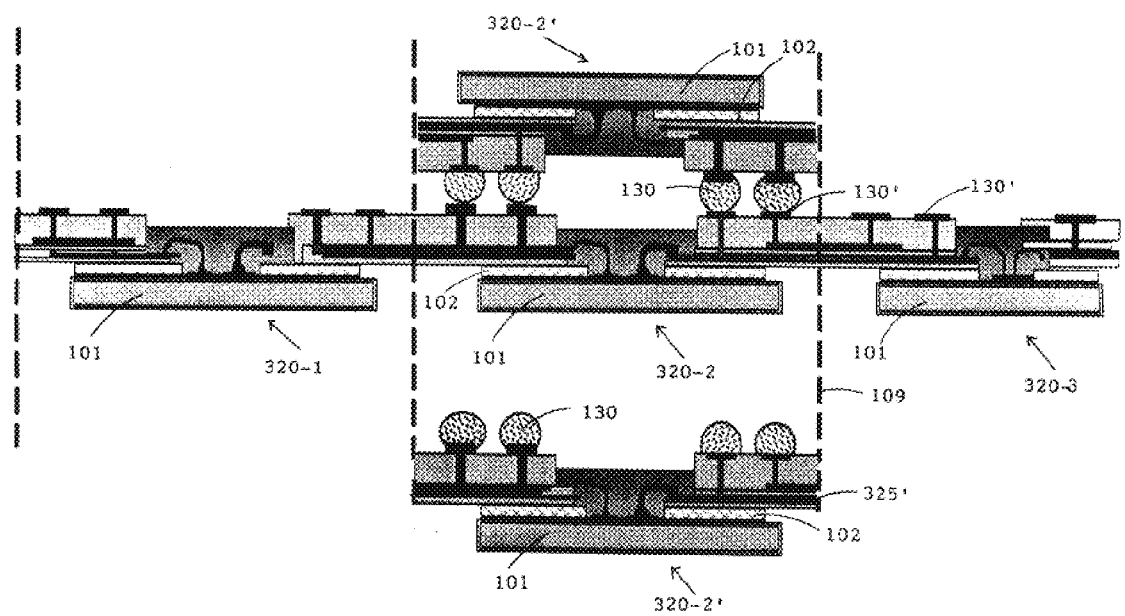
FIG. 2C shows a cross sectional view of a repaired MCM assembly with a known-good replacement SOC module attached at the bottom surface of the CSP-ready MCM board.

FIG. 2C shows an alternate method to repair a failed MCM assembly when one or more than one chips have failed in the burn-in or determined to be unacceptable after completion of the product acceptance tests. Suppose the SOC-module chip 120-2 is determined to be an unacceptable chip, an SOC-module flip chip 120-2" which is a known good die is attached to the bottom of the MCM board 110 to replaced the known-bad-die (KBD) 120-2. The CSP-ready connection terminals 140 disposed on the bottom surface of the CSP-ready MCM board 110 is formed to have identical footprint and in mirror image to a CSP chip or a flip chip for the known bad die. The CSP-ready connection terminals are ready for connection to a replacement chip 120-2" which is preferably an SOC-module flip chip as that shown in FIG. 1A or 1C.

Figure 3A:
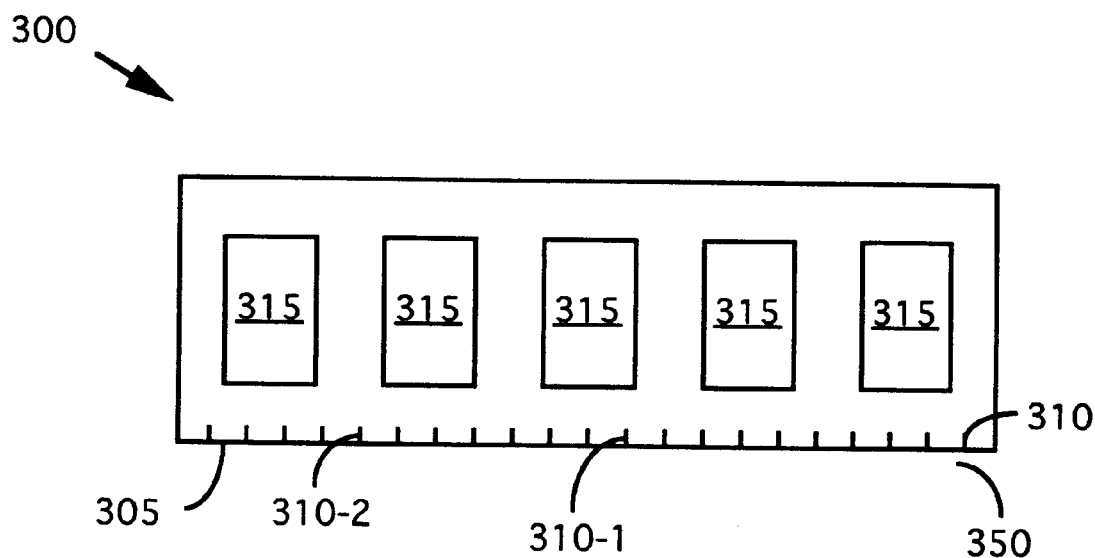
FIG. 3A shows top view of a CSP-ready MCM board which are provided with a plurality of standard edge testing pins for conducting both the burn-in and functional tests employing standard testing sockets.
Figure 3B:
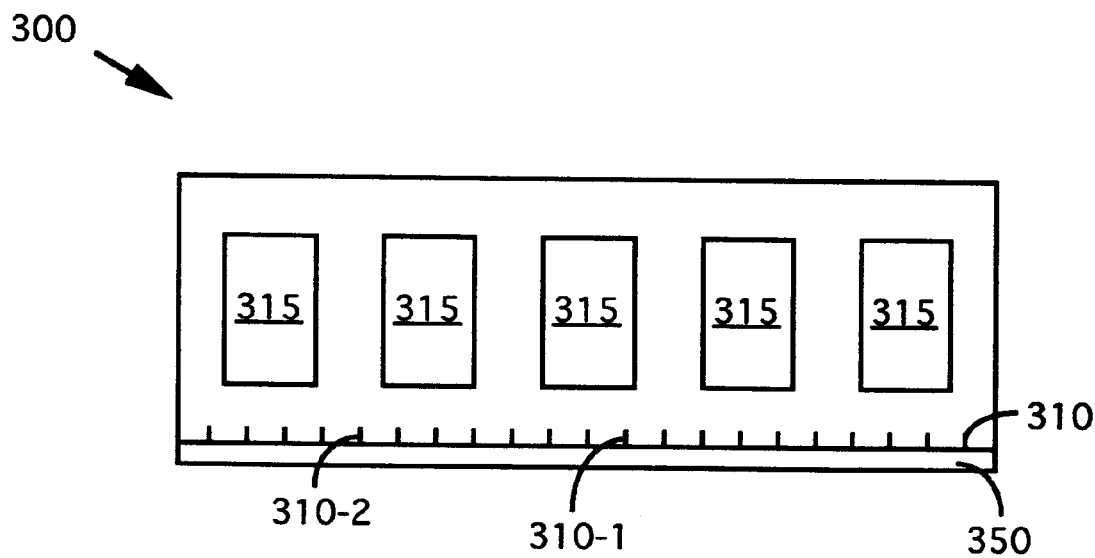
FIG. 3B shows a configuration of the MCM board with edge testing pins inserted into a standard testing socket for carrying out burn-in and functional tests directly on the MCM board.

Referring to FIG. 3A for top view of a CSP-ready MCM board 300 with a plurality of test pins 310 disposed on a testing insertion edge 305. There are multiple chips 315 mounted on this MCM board 300 and a plurality of conductive traces (not shown) connecting the chip connection terminals disposed on the board to the testing pins 310. There are two kinds of test pins among the test pins 310. The first kind of test pins are burn-in test pins 310-1 for connecting to a set of burn-in socket receptors disposed in a standard socket (see FIG. 3B) for conducting a burn-in test. The second kind of test pins are board-level test pins 310-2 for connecting to a set of board-level socket receptors disposed in the standard socket shown in FIG. 3B for conducting a board-level test. Unlike the testing procedures employed in the conventional MCM assembly, the burn-in tests and the board-level tests for the MCM assembly 300 are now carried out directly on the board and using a single standard testing socket as that shown in FIG. 3B below. The procedures are much simplified compared to the conventional processes where the burn-in tests are performed for each individual chip by using special sockets which can endure higher temperatures used for burn-in tests, then the board-level tests are applied when all the chips are mounted on the MCM board. Referring to FIG. 3B, the MCM board 300 is inserted into a standard testing socket 350 for performing a burn-in test and a board level test. The standard burn-in and board-level testing socket 350 is made of materials, which can sustain a burn-in test temperature ranging from 100 to 150° C. This standard burn-in and board-level testing socket 350 includes two types of socket receptors 360, namely the burn-in socket receptors 360-1 and board-level socket receptors 360-2, for receiving the burn-in test pins 310-1 and the board-level test pins 310-2 respectively. Again, the testing socket 350 is also novel from a conventional board-level test socket. The conventional board-level test sockets are only provided with board level test socket adapters to receive board level test pins. In contrast, the burn-in and board-level testing socket 350 includes a set of socket adapters 360-1 to receive a set of burn-in test pins 310-1 and another set of socket adapters 360-2 to receive a set of board level test pins 310-2. Furthermore, the burn-in and board-level test socket 350 are made with material to sustain a higher burn-in test temperature which is not required in a conventional MCM board test socket.

Figure 4A:
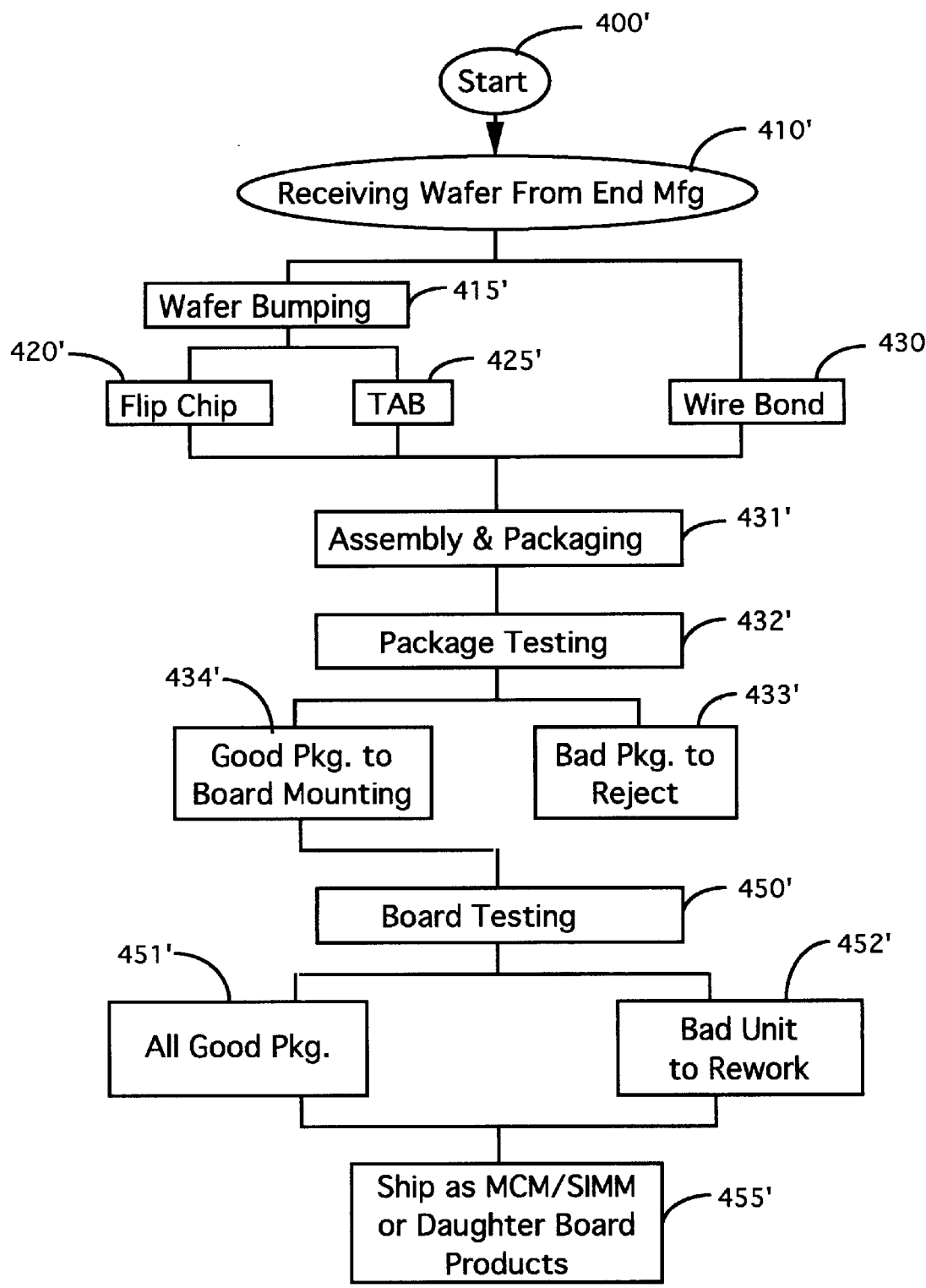
FIGS. 4A and 4B are two flow charts showing the processing steps employed by a conventional MCM packaging and testing method in comparison to a simplified method used by the MCM assembly mounted on a CSP-ready MCM board of this invention.

By employing a CSP-ready MCM board and conducting the burn-in and board level tests directly with the multiple chips mounted on the board as described above, the process flow is significantly simplified. A comparison of these different process flows used by a conventional MCM technique and that of a reusable CSP/MCM are listed in FIGS. 4A and 4B respectively as two flow charts in parallel. The flow charts illustrate the processing steps at different stages including a wafer stage, a chip package stage, a chip package testing stage, a board testing stage, and a final shipment/rework/reject stage. In FIG. 4A, the processes begin (step 400') by receiving the wafer from front-end integrated circuit manufacture facility (step 410'). A wafer-bumping step is carried out (step 415') followed by a flip chip (step 420') or TAB (step 425') processes to complete the wafer level preparation works. Otherwise, if it is a wire bond type of chips, a wire bonding process (step 430) is carried out to complete the wafer level preparation works. An assembly and packaging process is performed (step 431') followed by a package testing (step 432') which generally include the burn-in tests for the packaged chips to assure good dice are identified for further multiple chip mounting and testing processes. Bad packages of individual IC chips are identified and rejected (step 433'). The good packages are selected for board mounting (step 434'). A board level testing process is performed (step 450') to identify the MCM assembly which has all good chip packages on board (step 451') and ready for shipment (step 455'). Or, the bad units identified are reworked (step 452') to obtain a completely acceptable MCM assembly for shipment (step 455').

Figure 4B:
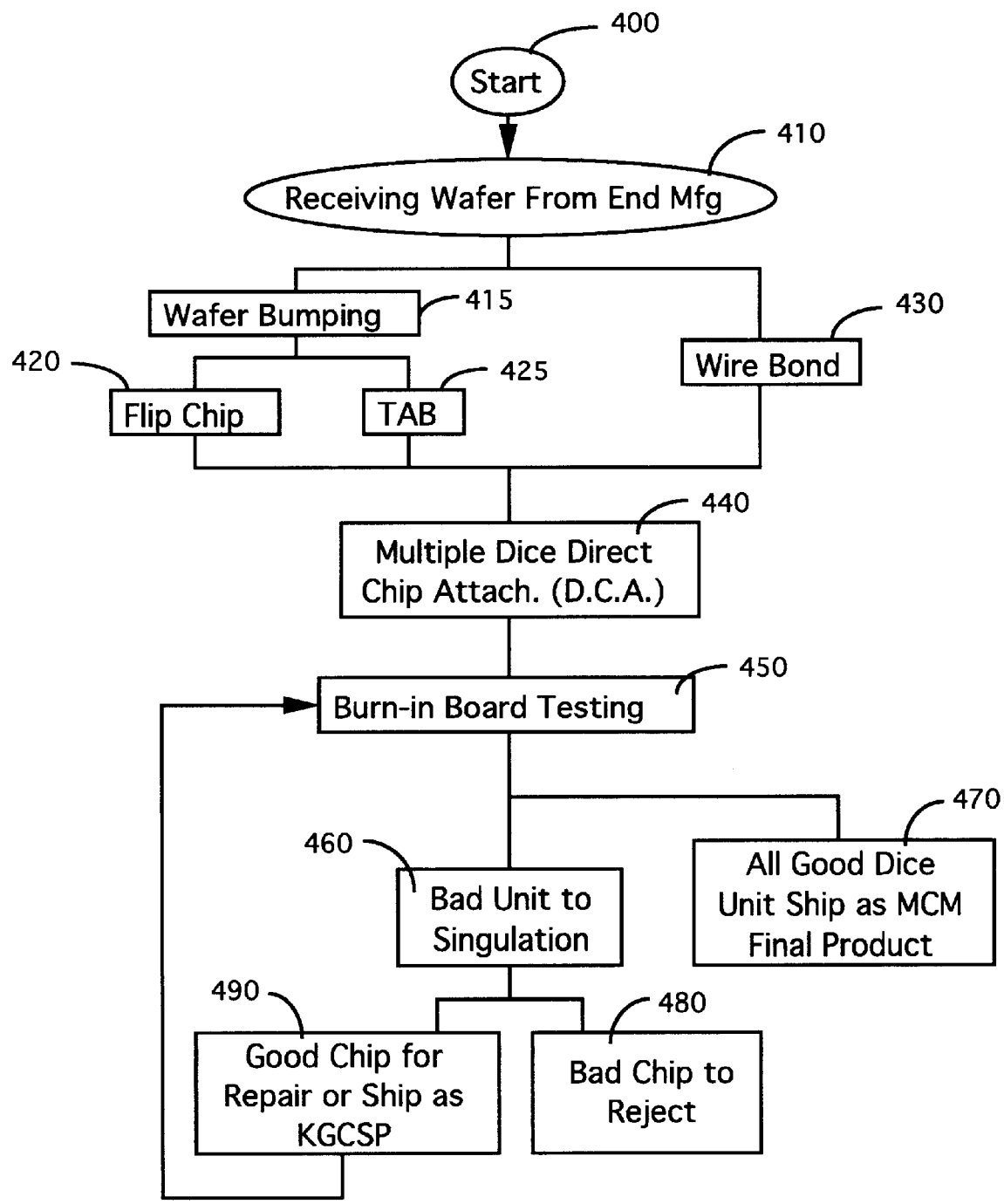

Comparing to the conventional method, FIG. 4B shows a much more simplified processing flow. After the wafer level of works, i.e., steps 400 to steps 430, are completed, the individual chips are directly mounted to a CSP-ready MCM board of this invention by a direct chip attachment method (step 440). A combined burn-in and board level testing process is performed (step 450). If there are bad chips identified, the identified known bad chips can be replaced by a back-side replacement chip attachment method as that described above to repair the MCM assembly for shipment as a good package (step 470). Or, the identified good units are singluated (step 460) and repackaged as a known good CSP and ready for subsequent board mounting (step 440) and the bad chip units are rejected (step 480).

According to FIGS. 1A to 4C, this invention discloses an integrated multiple-substrate-on-chip-module (MSOCM) assembly. This assembly includes a chip-size package (CSP)-ready MSOCM board 103 having a top surface and a bottom surface. The CSP-ready MCM board 103 includes a plurality of bonding-wire windows 104 and the bottom surface further includes a plurality of board bonding-pads 103' near the bonding-wire window. The assembly further includes an adhesive layer 102 disposed on top of the CSP-ready MCM board 103 having also having a plurality of bonding wire windows corresponding to and aligned with the bonding wire windows on the MCM board. The assembly further includes a plurality of integrated circuit (IC) chips 101 mounted onto the adhesive layer 102 over the top surface of the CSP-ready MCM board 103. Each of the IC chips 101 is provided with a plurality of chip bonding pads 101' facing an open space defined by the bonding wire windows 104. The assembly further includes a plurality of bonding wires 104' disposed in the space defined by the bonding-wire windows 104 and interconnected between each of the chip bonding pads 101' and a corresponding board bonding pad 103' disposed on the bottom surface of the CSP-ready MSOCM board 103.

In a preferred embodiment, the CSP-ready MSOCM board 103 and the adhesive layer 102 further include a plurality CSP-ready separation lines 109 dividing each of the SOC modules mounted thereon. In a preferred embodiment, the CSP-ready MSOCM board 103 further includes a plurality of via connectors 106 penetrating the CSP-ready MSOCM board 103 and in electrical connection with a plurality of the board bonding pads 103' via metal traces 105 disposed on the top surface of the MSOCM board 103. Each of the via connectors 106 further being in electric connection with a land grid array 130' disposed on the bottom surface of the MSOCM board 103. In a preferred embodiment, the land grid array 130' comprising a plurality of CSP-ready connection solder pads insulated by a plurality of solder masks.

In a preferred embodiment, the MSOCM assembly further includes a plurality of solder balls 130 mounted on a plurality of the CSP-ready solder pads 130' on the bottom surface of the CSP ready MSOCM board 103. In another preferred embodiment, the MSOCM assembly further includes a plurality of testing pins including a set of burn-in test pins and a set of board level test pins disposed on an edge of the CSP-ready MSOCM board 103 provided for conducting a plurality of burn-in and board level tests.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An integrated multiple-substrate-on-chip-module (MSOCM) assembly comprising:

a chip-size package (CSP)-ready MSOCM board having a top surface and a bottom surface, said CSP-ready MSOCM board includes a plurality of board bonding-wire windows opened in said MSOCM board and said CSP-ready MSOCM board further includes a plurality of board-bonding-pads disposed on said top surface of said CSP-ready MSOCM board near said bonding-wire window;

an adhesive layer disposed beneath said CSP-ready MSOCM board also having a plurality of adhesive-layer bonding wire windows corresponding to and aligned with said board bonding wire windows on said MSOCM board;

a plurality of integrated circuit (IC) chips mounted onto said adhesive layer under said bottom surface of said CSP-ready MSOCM board with each of said IC chips provided with a plurality of chip bonding pads facing an open space defined by said board bonding-wire windows;

a plurality of bonding wires disposed in said space defined by said board bonding-wire windows and adhesive-layer bonding-wire windows and interconnected between each of said chip bonding pads and a corresponding board bonding pad disposed on said top surface of said CSP-ready MSOCM board; and a CSP-ready land-grid array comprising a plurality of land-grid contact pads disposed on said top surface of said CSP-ready MSOCM board wherein said plurality of land-grid contact pads are arranged to have a standard CSP-footprint of said IC chips whereby each of said IC chips mounted onto said CSP-ready MSOCM board is provided to be separated into an individual CSP package.

2. The MSOCM assembly of claim 1 wherein:

said CSP-ready MSOCM board and said adhesive layer further include a plurality CSP-ready separation lines dividing each said IC chips mounted onto said bottom surface of said CSP-ready MSOCM board for separating said MSOCM assembly into a plurality of standard individual CSP packages each contain one of said IC chips each having said plurality of land-grid contact pads ready to form a CSP package.

3. The MSCCM assembly of claim 1 wherein:

said CSP-ready MSOCM board further includes a plurality of via connectors penetrating said CSP-ready MSOCM board and in electrical connection with a plurality of said chip bonding pads via metal traces disposed on said bottom surface of said MSOCM board; and each of said via connectors further connected to one of said land grid contact pads disposed on said top surface of said MSOCM board.

4. The MSOCM assembly of claim 1 wherein:

said land grid array comprising said plurality of land grid contact pads constituting CSP-ready solder pads disposed on said top surface of said MSOCM board are insulated by a plurality of solder masks disposed between said land grid contact pads.

5. The MSOCM assembly of claim 1 further comprising:

a plurality of solder balls, each mounted on one of said land grid contact pads disposed on said top surface of said CSP-ready MSOCM board.

6. The MSOCM assembly of claim 1 further comprising:

a plurality of testing pins including a set of burn-in test pins and a set of board level test pins disposed on an edge of said CSP-ready MSOCM board and connected to said IC chips provided for conducting a plurality of burn-in and board level tests.

7. The MSOCM assembly of claim 1 wherein:

each of said board bonding-wire windows opened in said CSP-ready MSOCM board above each of said IC chips further comprising a bigger opening near said top surface of said CSP-ready MSOCM board wherein an interface between said bigger opening and a smaller opening at a bottom portion of said board bonding-wire window providing a platform for disposing said board bonding-pads thereon.

8. The MSOCM assembly of claim 1 further comprising:

a liquid encapsulation filler filling each of said board bonding-wire windows; and each of said board bonding-wire windows further comprising a liquid encapsulation dam disposed on said top surface of said CSP-ready MSOCM board surrounding each of said board bonding-wire windows for keeping said liquid encapsulation filler from flowing outside of said liquid encapsulation dam.

9. The MSOCM assembly of claim 1 wherein:

said CSP-ready MSOCM board comprising a metal core CSP-ready MSOCM board.

10. The MSOCM assembly of claim 1 wherein:

said CSP-ready MSOCM board comprising a laminated multiple-layered board; and said CSP-ready MSOCM board further having a plurality of built-in passive circuit elements supported on said CSP-ready MSOCM board.

11. A chip-size package (CSP)-ready multiple substrate-on-chip module (MSOCM) board comprising:

a top surface and a bottom surface;

a plurality of bonding-wire windows opened in said CSP-ready MSOCM board with a plurality of board-bonding pads disposed on said top surface surrounding each of said bonding wire windows;

a CSP-ready land-grid array comprising a plurality of land-grind contact pads disposed on said top surface of said CSP-ready MSOCM board wherein said plurality of land-grid contact pads are arranged to have a standard CSP-footprint for packaging IC chips provided to mount onto said CSP-ready MSOCM whereby each of said IC chips when mounted onto said CSP-ready MSOCM board is provided to be separated into an individual CSP package having said standard CSP footprint.

12. The CSP-ready MSOCM board of claim 11 further comprising:

a plurality CSP-ready separation lines for separating said CSP-ready MSOCM board with said IC chips into a plurality of standard individual CSP packages each contain one of said IC chips.

13. The CSP-ready MSOCM board of claim 11 further comprising:

a plurality of via connectors penetrating said CSP-ready MSOCM board and in electrical connection with each of said IC chips via metal traces disposed on said bottom surface of said MSOCM board; and each of said via connectors further connected with one of said land grid contact pads disposed on said top surface of said CSP-ready MSCM board.

14. The CSP-ready MSOCM board of claim 11 wherein:

a plurality of solder masks, each disposed between said land grid contact pads for providing insulation between said land grid contact pads.

15. The CSP-ready MSOCM board of claim 11 further comprising:

a plurality of solder balls, each mounted on top of one of said land grid contact pads disposed on said top surface of said CSP-ready MSOCM board.

16. The CSP-ready MSOCM board of claim 11 further comprising:

a plurality of testing pins including a set of burn-in test pins and a set of board level test pins disposed on an edge of said CSP-ready MSOCM board and connected to said IC chips for conducting a plurality of burn-in and board level tests.

17. The CSP-ready MSOCM board of claim 11 wherein:

each of said board bonding-wire windows further comprising a bigger opening near said top surface of said CSP-ready MSOCM board wherein an interface between said bigger opening and a smaller opening at a bottom portion of said board bonding-wire windows defining a platform for disposing said board bonding-pads thereon.

18. The CSP-ready MSOCM board of claim 11 further comprising:

a liquid encapsulation filler filling each of said board bonding-wire windows; and each of said board bonding-wire windows further comprising a liquid encapsulation dam disposed on said top surface of said CSP-ready MSOCM board surrounding said board bonding-wire window for keeping said liquid encapsulation filler in said board bonding-wire windows.

19. The CSP-ready MSOCM board of claim 11 wherein:

said CSP-ready MSOCM board comprising a metal core CSP-ready MSOCM board.

20. The CSP-ready MSOCM board of claim 11 wherein:

said CSP-ready MSOCM board comprising a laminated multiple-layered board; and a plurality of built-in passive circuit elements supported on said CSP-ready MSOCM board.

21. A chip-size package (CSP)-ready multiple substrate-on-chip module (MSOCM) board, having a top surface and bottom surface, comprising:

a plurality of bonding-wire windows opened in said CSP-ready MSOCN board with a plurality of board-boarding pads disposed on said top surface surrounding each of said bonding wire windows;

a plurality of CSP-ready contact pads disposed on said top surface of said CSP-ready MSOCM board wherein said plurality of contact pads are arranged to have a standard CSP-footprint for packaging IC chips provided to mount onto said CSP-ready MSOCM board whereby each of said IC chips when mounted onto said CSP-ready MSOCM board is provided to be separated into an individual CSP package having said standard CSP footprint.

\* \* \* \* \*

US006249052C1

(12) EX PARTE REEXAMINATION CERTIFICATE (9456th)
United States Patent
Lin

(10) Number: US 6,249,052 C1
(45) Certificate Issued: Dec. 26, 2012

(54) SUBSTRATE ON CHIP (SOC) MULTIPLE-CHIP MODULE (MCM) WITH CHIP-SIZE PACKAGE (CSP) READY CONFIGURATION

(75) Inventor: Paul T. Lin, Fremont, CA (US)

(73) Assignee: Lin Packaging Technologies, Ltd., Marshall, TX (US)

Reexamination Request:
No. 90/009,784, Jul. 20, 2010

Reexamination Certificate for:
Patent No.: 6,249,052
Issued: Jun. 19, 2001
Appl. No.: 09/314,493
Filed: May 18, 1999

Related U.S. Application Data

(60) Provisional application No. 60/087,604, filed on Jun. 1, 1998.

(51) Int. Cl.
H01L 21/4763 (2006.01)
(52) U.S. Cl. .......................... 257/737; 257/734; 257/778
(58) Field of Classification Search .................. None
See application file for complete search history.

(56) References Cited

To view the complete listing of prior art documents cited during the proceeding for Reexamination Control Number 90/009,784, please refer to the USPTO's public Patent Application Information Retrieval (PAIR) system under the Display References tab.

Primary Examiner — Hetul Patel

(57) ABSTRACT

The present invention includes an integrated multiple-substrate-on-chip-module (MSOCM) assembly. This assembly includes a chip-size package (CSP)-ready MSOCM board having a top surface and a bottom surface. The CSP-ready MCM board includes a plurality of bonding-wire windows and the bottom surface further includes a plurality of board bonding-pads near the bonding-wire window. The assembly further includes an adhesive layer disposed on top of the CSP-ready MCM board having also having a plurality of bonding wire windows corresponding to and aligned with the bonding wire windows on the MCM board. The assembly further includes a plurality of integrated circuit (IC) chips mounted onto the adhesive layer over the top surface of the CSP-ready MCM board. Each of the IC chips is provided with a plurality of chip bonding pads facing an open space defined by the bonding wire windows. The assembly further includes a plurality of bonding wires disposed in the space defined by the bonding-wire windows and interconnected between each of the chip bonding pads and a corresponding board bonding pad disposed on the bottom surface of the CSP-ready MSOCM board.

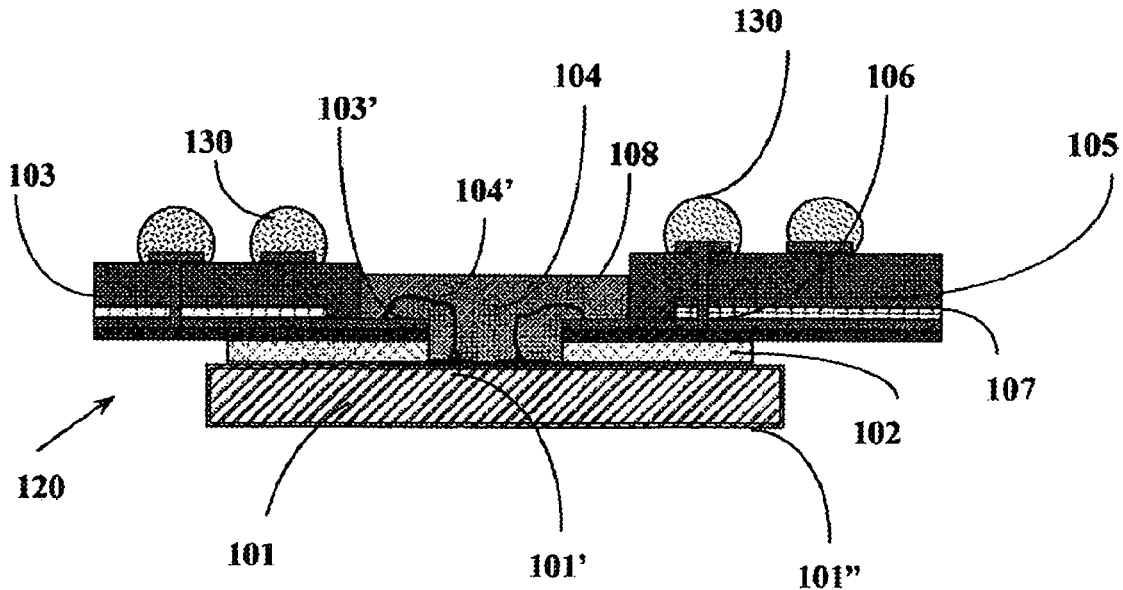

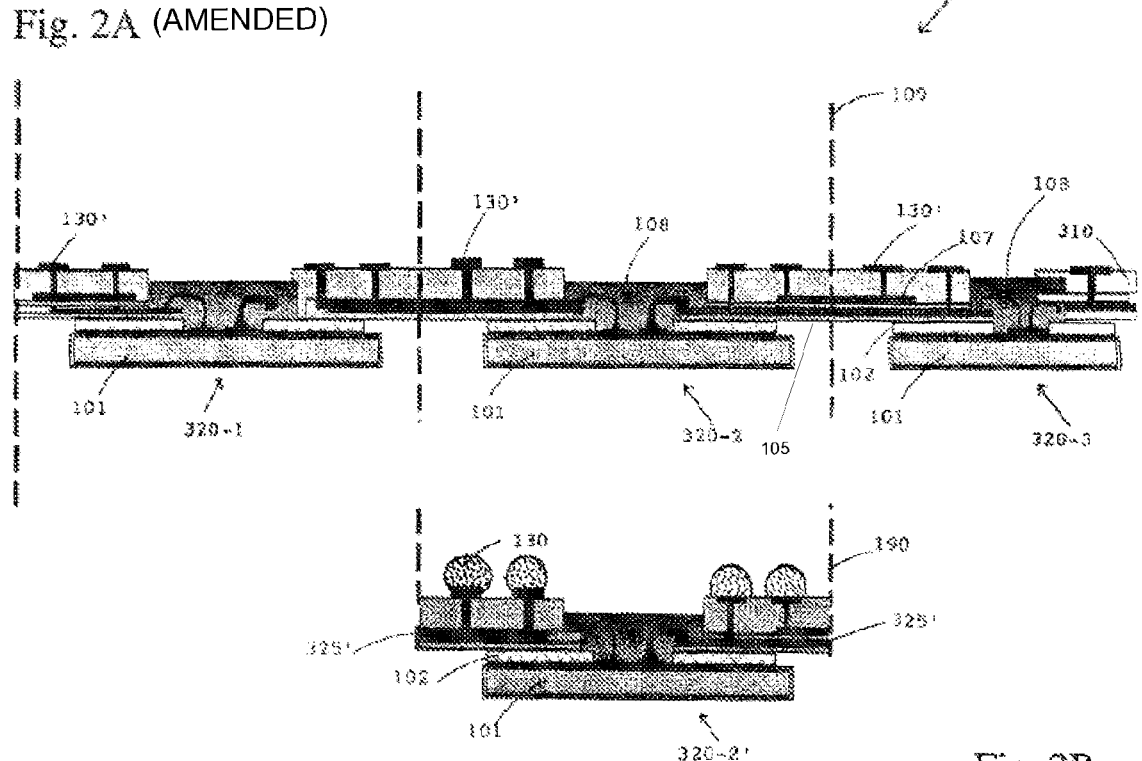
Fig. 2A (AMENDED)
Fig. 2B

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

THE DRAWINGS FIGURE HAVE BEEN CHANGED AS FOLLOWS:

On FIG. 2A, The reference number 105 has been added.

AS A RESULT OF REEXAMINATION, IT HAS BEEN DETERMINED THAT:

Claims 1, 3-4, 6-7, 9, 11-14, 16-17 and 19-21 are determined to be patentable as amended.

Claims 2, 5, 8, 10, 15 and 18, dependent on an amended claim, are determined to be patentable.

New claims 22-68 and 69 are added and determined to be patentable.

1. An integrated multiple-substrate-on-chip-module (MSOCM) assembly comprising:
    a chip-size package (CSP)-ready MSOCM board having a top surface and a bottom surface, said CSP-ready MSOCM board includes a plurality of board bonding-wire windows opened in said MSOCM board and said CSP-ready MSOCM board further includes a plurality of board-bonding-pads disposed on said top surface of said CSP-ready MSOCM board near said bonding-wire window;
    an adhesive layer disposed beneath said CSP-ready MSOCM board also having a plurality of adhesive-layer bonding wire windows corresponding to and aligned with said board bonding wire windows on said MSOCM board;
    a plurality of integrated circuit (IC) chips mounted onto said adhesive layer under said bottom surface of said CSP-ready MSOCM board with each of said IC chips provided with a plurality of chip bonding pads facing an open space defined by said board bonding-wire windows;
    a plurality of bonding wires disposed in said space defined by said board bonding-wire windows and adhesive-layer bonding-wire windows and interconnected between each of said chip bonding pads and a corresponding board bonding pad disposed on said top surface of said CSP-ready MSOCM board; and
    a CSP-ready land-grid array comprising a plurality of land-grid contact pads disposed on said top surface of said CSP-ready MSOCM board wherein said plurality of land-grid contact pads are arranged to have a standard CSP-footprint of said IC chips whereby each of said IC chips mounted onto said CSP-ready MSOCM board is provided to be separated into an individual CSP package,
    *wherein said CSP-ready MSOCM board further includes a plurality of conductive traces interconnecting at least some of said plurality of IC chips.*

3. The [MSCCM] *MSOCM* assembly of claim 1 wherein:
    said CSP-ready MSOCM board further includes a plurality of via connectors penetrating said CSP-ready MSOCM board and in electrical connection with a plurality of said chip bonding pads via metal traces disposed on said bottom surface of said MSOCM board; and
    each of said via connectors connected to one of said land grid contact pads disposed on said top surface of said MSOCM board.

4. The MSOCM assembly of claim 1 wherein:
    said [land grid array comprising said plurality of] land grid contact pads [constituting CSP-ready solder pads disposed on said top surface of said MSOCM board] are insulated by a plurality of solder masks disposed between said land grid contact pads.

6. The MSOCM assembly of claim 1 further comprising:
    a plurality of testing pins [including a set of burn-in test pins and a set of board level test pins] disposed on an edge of said CSP-ready MSOCM board and connected to said IC chips provided for conducting [a plurality of burn-in and] board level tests.

7. The MSOCM assembly of claim 1 wherein:
    each of said board bonding-wire windows opened in said CSP-ready MSOCM board above each of said IC chips further comprising a bigger opening near *a portion of* said top surface of said CSP-ready MSOCM board wherein an interface between said bigger opening and a smaller opening at a bottom portion of said board bonding-wire window providing a platform for disposing said board bonding-pads thereon.

9. The MSOCM assembly of claim 1 wherein:
    said CSP-ready MSOCM board [comprising] *further comprises* a metal core [CSP-ready MSOCM board].

11. A chip-size package (CSP)-ready multiple substrate-on-chip module (MSOCM) board comprising:
    a top surface and a bottom surface;
    a plurality of bonding-wire windows opened in said CSP-ready MSOCM board with a plurality of board-bonding pads disposed on said top surface surrounding each of said bonding wire windows;
    a CSP-ready land-grid array comprising a plurality of [land-grind] *land-grid* contact pads disposed on said top surface of said CSP-ready MSOCM board wherein said plurality of land-grid contact pads are arranged to have a standard CSP-footprint for packaging IC chips provided to mount onto said CSP-ready MSOCM whereby each of said IC chips when mounted onto said CSP-ready MSOCM board is provided to be separated into an individual CSP package having said standard CSP footprint; *and*
    *a plurality of conductive traces interconnecting at least some of said board-bonding pads of different ones of said plurality of bonding-wire windows.*

12. The CSP-ready MSOCM board of claim 11 further comprising:
    a plurality CSP-ready separation lines for separating said CSP-ready MSOCM board with said IC chips into a plurality of standard individual CSP packages *that* each contain one of said IC chips.

13. The CSP-ready MSOCM board of claim 11 further comprising:
    a plurality of via connectors penetrating said CSP-ready MSOCM board and in electrical connection with each of said IC chips via metal traces disposed on said bottom surface of said MSOCM board; and each of said via connectors connected with one of said land grid contact pads disposed on said top surface of said CSP-ready [MSCM] *MSOCM* board.

14. The CSP-ready MSOCM board of claim 11 [wherein:] *further comprising* a plurality of solder masks, each disposed between said land grid contact pads for providing insulation between said land grid contact pads.

16. The CSP-ready MSOCM board of claim 11 further comprising:
a plurality of testing pins [including a set of burn-in test pins and a set of board level test pins] disposed on an edge of said CSP-ready MSOCM board and connected to said IC chips for conducting [a plurality of burn-in and] board level tests.

17. The CSP-ready MSOCM board of claim 11 wherein:
each of said board bonding-wire windows further comprising a bigger opening near *a portion of* said top surface of said CSP-ready MSOCM board wherein an interface between said bigger opening and a smaller opening at a bottom portion of said board bonding-wire windows defining a platform for disposing said board bonding-pads thereon.

19. The CSP-ready MSOCM board of claim 11 wherein:
said CSP-ready MSOCM board [comprising] *further comprises* a metal core [CSP-ready MSOCM board].

20. The CSP-ready MSOCM board of claim 11 wherein:
said CSP-ready MSOCM board comprising a laminated multiple-layered board; and
*further comprising* a plurality of built-in passive circuit elements supported on said CSP-ready MSOCM board.

21. A chip-size package (CSP)-ready multiple substrate-on-chip module (MSOCM) board, having a top surface and bottom surface, comprising:
a plurality of bonding-wire windows opened in said CSP-ready [MSOCN] *MSOCM* board with a plurality of board-boarding pads disposed on said top surface surrounding each of said bonding wire windows;
*a plurality of conductive traces interconnecting at least some of said board-bonding pads of different ones of said plurality of bonding-wire windows; and*
a plurality of CSP-ready contact pads disposed on said top surface of said CSP-ready MSOCM board wherein said plurality of contact pads are arranged to have a standard CSP-footprint for packaging IC chips provided to mount onto said CSP-ready MSOCM board whereby each of said IC chips when mounted onto said CSP-ready MSOCM board is provided to be separated into an individual CSP package having said standard CSP footprint.

22. *The CSP-ready MSOCM board of claim 21, further comprising separation lines for separating said CSP-ready MSOCM board into a plurality of standard individual CSP packages that each contain one of said IC chips.*

23. *The CSP-ready MSOCM board of claim 21, further comprising a plurality of via connectors penetrating said CSP-ready MSOCM board, each of said via connectors connected with one of said contact pads disposed on said top surface of said CSP-ready MSOCM board and in electrical connection with at least one of said board-bonding pads.*

24. *The CSP-ready MSOCM board of claim 21, further comprising a plurality of solder masks, each disposed between said contact pads for providing insulation between said contact pads.*

25. *The CSP-ready MSOCM board of claim 21, further comprising a plurality of solder balls, each mounted on one of said contact pads disposed on said top surface of said CSP-ready MSOCM board.*

26. *The CSP-ready MSOCM board of claim 21, further comprising a plurality of testing pins disposed on an edge of said CSP-ready MSOCM board and connected to said IC chips for conducting board level tests.*

27. *The CSP-ready MSOCM board of claim 21, wherein each of said bonding-wire windows further comprising a bigger opening near a portion of said top surface of said CSP-ready MSOCM board wherein an interface between said bigger opening and a smaller opening at a bottom portion of said bonding-wire windows defining a platform for disposing said board-bonding pads thereon.*

28. *The CSP-ready MSOCM board of claim 21, further comprising dams disposed on said top surface of said CSP-ready MSOCM board surrounding said board bonding-wire windows for keeping a liquid encapsulation filler in said board bonding-wire windows.*

29. *The CSP-ready MSOCM board of claim 21, wherein said CSP-ready MSOCM board has a metal core.*

30. *The CSP-ready MSOCM board of claim 21, further comprising a plurality of passive circuit elements in said CSP-ready MSOCM board.*

31. *The MSOCM assembly of claim 1, wherein the assembly has only a single level of substrate.*

32. *A method comprising:*
*receiving a plurality of integrated circuit (IC) chips, each of said IC chips having a plurality of chip bonding pads*
*mounting said plurality of IC chips to a chip-size package (CSP)-ready multiple-substrate-on-chip-module (MSOCM) board having a top surface and a bottom surface, said CSP-ready MSOCM board comprising:*
*a plurality of board bonding-wire windows opened in said MSOCM board;*
*a plurality of board bonding pads disposed on said top surface of said CSP-ready MSOCM board near each of said bonding-wire windows;*
*a plurality of land-grid contact pads disposed on said top surface of said CSP-ready MSOCM board and arranged to have a standard CSP-footprint of said IC chips; and*
*a plurality of conductive traces interconnecting at least some of said board bonding pads of different ones of said plurality of board bonding-wire windows, said mounting using an adhesive layer disposed beneath said CSP-ready MSOCM board and having a plurality of adhesive-layer bonding wire windows corresponding to and aligned with said board bonding wire windows on said MSOCM board; and*
*bonding said IC chips to said CSP-ready MSOCM board to form an assembled MSOCM, the bonding using a plurality of bonding wires disposed in spaces defined by said board bonding-wire windows and adhesive-layer bonding-wire windows and interconnected between said chip bonding pads and said board bonding pads, wherein each of said IC chips mounted onto said CSP-ready MSOCM board is separable into an individual CSP package.*

33. *The method of claim 32, further comprising testing said assembled MSOCM.*

34. *The method of claim 33, further comprising singulating, based on said testing, said IC chips for use as individual CSP packages.*

35. *The method of claim 33, further comprising repairing said integrated multiple-substrate-on-chip-module based on said testing, said repairing comprising mounting a second individual CSP package to said plurality of land-grid contact pads.*

36. A method comprising:
receiving a plurality of integrated circuit (IC) chips, each of said IC chips having a plurality of chip bonding pads
mounting said plurality of IC chips to a chip-size package (CSP)-ready multiple-substrate-on-chip-module (MSOCM) board having a top surface and a bottom surface, said CSP-ready MSOCM board comprising:
 a plurality of board bonding-wire windows opened in said MSOCM board;
 a plurality of board bonding pads disposed on said top surface of said CSP-ready MSOCM board near each of said bonding-wire windows;
 a plurality of land-grid contact pads disposed on said top surface of said CSP-ready MSOCM board and arranged to have a standard CSP-footprint of said IC chips; and
 a plurality of conductive traces interconnecting at least some of said board bonding pads of different ones of said plurality of board bonding-wire windows, said mounting using an adhesive layer disposed beneath said CSP-ready MSOCM board and having a plurality of adhesive-layer bonding wire windows corresponding to and aligned with said board bonding wire windows on said MSOCM board;
bonding said IC chips to said CSP-ready MSOCM board to form an assembled MSOCM, the bonding using a plurality of bonding wires disposed in spaces defined by said board bonding-wire windows and adhesive-layer bonding-wire windows and interconnected between said chip bonding pads and said board bonding pads, wherein each of said IC chips mounted onto said CSP-ready MSOCM board is separable into an individual CSP package; and
testing said assembled MSOCM,
wherein said assembled MSOCM is assembled without testing the individual CSP packages.

37. The method of claim 36, further comprising singulating, based on said testing, said IC chips for use as individual CSP packages.

38. The method of claim 36, further comprising repairing said integrated multiple-substrate-on-chip-module based on said testing, said repairing comprising mounting a second individual CSP package to said plurality of land-grid contact pads.

39. An integrated multiple-substrate-on-chip-module (MSOCM) assembly comprising:
 a chip-size package (CSP)-ready MSOCM board having a top surface and a bottom surface, said CSP-ready MSOCM board includes a plurality of board bonding-wire windows opened in said MSOCM board and said CSP-ready MSOCM board further includes a plurality of board-bonding-pads disposed on said top surface of said CSP-ready MSOCM board near said bonding-wire window;
 an adhesive layer disposed beneath said CSP-ready MSOCM board also having a plurality of adhesive-layer bonding wire windows corresponding to and aligned with said board bonding wire windows on said MSOCM board;
 a plurality of integrated circuit (IC) chips mounted onto said adhesive layer under said bottom surface of said CSP-ready MSOCM board with each of said IC chips provided with a plurality of chip bonding pads facing an open space defined by said board bonding-wire windows;
 a plurality of bonding wires disposed in said space defined by said board bonding-wire windows and adhesive-layer bonding-wire windows and interconnected between each of said chip bonding pads and a corresponding board bonding pad disposed on said top surface of said CSP-ready MSOCM board; and
 a CSP-ready land-grid array comprising a plurality of land-grid contact pads disposed on said top surface of said CSP-ready MSOCM board wherein said plurality of land-grid contact pads are arranged to have a standard CSP-footprint of said IC chips whereby each of said IC chips mounted onto said CSP-ready MSOCM board is provided to be separated into an individual CSP package,
wherein said CSP-ready MSOCM board further includes a plurality of conductive traces interconnecting at least some of said plurality of IC chips,
wherein said plurality of land-grid contact pads are further arranged for mounting a second individual CSP package for repair of a faulty one of said plurality of IC chips.

40. The MSOCM assembly of claim 39 wherein said CSP-ready MSOCM board and said adhesive layer further include a plurality CSP-ready separation lines dividing each said IC chips mounted onto said bottom surface of said CSP-ready MSOCM board for separating said MSOCM assembly into a plurality of standard individual CSP packages each contain one of said IC chips each having said plurality of land-grid contact pads ready to form a CSP package.

41. The MSOCM assembly of claim 39 wherein:
said CSP-ready MSOCM board further includes a plurality of via connectors penetrating said CSP-ready MSOCM board and in electrical connection with a plurality of said chip bonding pads via metal traces disposed on said bottom surface of said MSOCM board; and
each of said via connectors connected to one of said land grid contact pads disposed on said top surface of said MSOCM board.

42. The MSOCM assembly of claim 39 wherein said land grid contact pads are insulated by a plurality of solder masks disposed between said land grid contact pads.

43. The MSOCM assembly of claim 39 further comprising a plurality of solder balls, each mounted on one of said land grid contact pads disposed on said top surface of said CSP-ready MSOCM board.

44. The MSOCM assembly of claim 39 further comprising a plurality of testing pins disposed on an edge of said CSP-ready MSOCM board and connected to said IC chips provided for conducting board level tests.

45. The MSOCM assembly of claim 39 wherein each of said board bonding-wire windows opened in said CSP-ready MSOCM board above each of said IC chips further comprising a bigger opening near a portion of said top surface of said CSP-ready MSOCM board wherein an interface between said bigger opening and a smaller opening at a bottom portion of said board bonding-wire window providing a platform for disposing said board bonding-pads thereon.

46. The MSOCM assembly of claim 39 further comprising:
 a liquid encapsulation filler filling each of said board bonding-wire windows; and
 each of said board bonding-wire windows further comprising a liquid encapsulation dam disposed on said top surface of said CSP-ready MSOCM board surrounding each of said board bonding-wire windows for keeping said liquid encapsulation filler from flowing outside of said liquid encapsulation dam.

47. The MSOCM assembly of claim 40 wherein said CSP-ready MSOCM board further comprises a metal core.

48. The MSOCM assembly of claim 41 wherein:
said CSP-ready MSOCM board comprising a laminated multiple-layered board; and
said CSP-ready MSOCM board further having a plurality of built-in passive circuit elements supported on said CSP-ready MSOCM board.

49. The MSOCM assembly of claim 42, wherein the assembly has only a single level of substrate.

50. A chip-size package (CSP)-ready multiple substrate-on-chip module (MSOCM) board comprising:
a top surface and a bottom surface;
a plurality of bonding-wire windows opened in said CSP-ready MSOCM board with a plurality of board-bonding pads disposed on said top surface surrounding each of said bonding wire windows;
a CSP-ready land-grid array comprising a plurality of land-grid contact pads disposed on said top surface of said CSP-ready MSOCM board wherein said plurality of land-grid contact pads are arranged to have a standard CSP-footprint for packaging IC chips provided to mount onto said CSP-ready MSOCM whereby each of said IC chips when mounted onto said CSP-ready MSOCM board is provided to be separated into an individual CSP package having said standard CSP footprint; and
a plurality of conductive traces interconnecting at least some of said board-bonding pads of different ones of said plurality of bonding-wire windows,
wherein said plurality of land-grid contact pads are further arranged for mounting a second individual CSP package for repair of a faulty one of said IC chips.

51. The CSP-ready MSOCM board of claim 50 further comprising a plurality CSP-ready separation lines for separating said CSP-ready MSOCM board with said IC chips into a plurality of standard individual CSP packages that each contain of said IC chips.

52. The CSP-ready MSOCM board of claim 50 further comprising:
a plurality of via connectors penetrating said CSP-ready MSCOCM board and in electrical connection with each of said IC chips via metal traces disposed on said bottom surface of said MSOCM board; and
each of said via connectors connected with one of said land grid contact pads disposed on said top surface of said CDP-ready MSOCM board.

53. The CSP-ready MSOCM board of claim 50 further comprising a plurality of solder masks, each disposed between said land grid contact pads for providing insulation between said land grid contact pads.

54. The CSP-ready MSOCM board of claim 50 further comprising a plurality solder balls, each mounted on top of one of said land grid contact pads disposed on said top surface of said CSP-ready MSOCM board.

55. The CSP-ready MSOCM board of claim 50 further comprising a plurality testing pins disposed on an edge of said CSP-ready MSOCM board and connected to said IC chips for conducting board level tests.

56. The CSP-ready MSOCM board of claim 50 wherein each of said board bonding-wire windows further comprising a bigger opening near a portion of said top surface of said CSP-ready MSOCM board wherein an interface between said bigger opening and a smaller opening at a bottom portion of said board bonding-wire windows defining a platform for disposing said board bonding-pads thereon.

57. The CSP-ready MSOCM board of claim 50 further comprising:
a liquid encapsulation filler filling each of said board bonding-wire windows; and
each of said board bonding-wire windows further comprising a liquid encapsulation dam disposed on said top surface of said CSP-ready MSOCM board surrounding said board bonding-wire window for keeping said liquid encapsulation filler in said board bonding-wire windows.

58. The CSP-ready MSOCM board of claim 50 wherein said CSP-ready MSOCM board further comprises a metal core.

59. The CSP-ready MSOCM board of claim 50 wherein:
said CSP-ready MSOCM board comprising a laminated multiple-layered board; and
further comprising a plurality of built-in passive circuit elements supported on said CSP-ready MSOCM board.

60. A chip-size package (CSP)-ready multiple substrate-on-chip module (MSOCM) board, having a top surface and bottom surface, comprising:
a plurality of bonding-wire windows opened in said CSP-ready MSOCM board with a plurality of board-boarding pads disposed on said top surface surrounding each of said bonding wire windows;
a plurality of conductive traces interconnecting at least some of said board-bonding pads of different ones of said plurality of bonding-wire windows; and
a plurality of CSP-ready contact pads disposed on said top surface of said CSP-ready MSOCM board wherein said plurality of contact pads are arranged to have a standard CSP-footprint for packaging IC chips provided to mount onto said CSP-ready MSOCM board whereby each of said IC chips when mounted onto said CSP-ready MSCOCM board is provided to be separated into an individual CSP package having said standard CSP footprint,
wherein said plurality of contact pads are further arranged for mounting a second individual CSP package for repair of a faulty one of said IC chips.

61. The CSP-ready MSOCM board of claim 60, further comprising separation lines for separating said CSP-ready MSOCM board into a plurality of standard individual CSP packages that each contain one of said IC chips.

62. The CSP-ready MSOCM board of claim 60, further comprising a plurality of via connectors penetrating said CSP-ready MSOCM board, each of said via connectors connected with one of said contact pads disposed on said top surface of said CSP-ready MSOCM board and in electrical connection with at least one of said board-bonding pads.

63. The CSP-ready MSOCM board of claim 60, further comprising a plurality of solder masks, each disposed between said contact pads for providing insulation between said contact pads.

64. The CSP-ready MSOCM board of claim 60, further comprising a plurality of solder balls, each mounted on one of said contact pads disposed on said top surface of said CSP-ready MSOCM board.

65. The CSP-ready MSOCM board of claim 60, further comprising a plurality of testing pins disposed on an edge of said CSP-ready MSOCM board and connected to said IC chips for conducting board level tests.

66. The CSP-ready MSOCM board of claim 60, wherein each of said bonding-wire windows further comprising a bigger opening near a portion of said top surface of said CSP-ready MSOCM board wherein an interface between said bigger opening and a smaller opening at a bottom portion of said bonding-wire windows defining a platform for disposing said board-bonding pads thereon.

67. The CSP-ready MSOCM board of claim 60, further comprising dams disposed on said top surface of said CSP-ready MSOCM board surrounding said board bonding-wire windows for keeping a liquid encapsulation filler in said board bonding-wire windows.

68. The CSP-ready MSOCM board of claim 60, wherein said CSP-ready MSOCM board has a metal core.

69. The CSP-ready MSOCM board of claim 60, further comprising a plurality of passive circuit elements in said CSP-ready MSOCM board.

* * * * *